United States Patent
Akiba et al.

(10) Patent No.: US 9,362,683 B2
(45) Date of Patent: Jun. 7, 2016

(54) SIGNAL TRANSMISSION CABLE

(71) Applicant: Sony Corporation, Tokyo (JP)

(72) Inventors: Akira Akiba, Kanagawa (JP); Mitsuo Hashimoto, Kanagawa (JP); Shinya Morita, Tokyo (JP); Shun Mitarai, Kanagawa (JP); Mikihiro Taketomo, Kanagawa (JP); Kazunao Oniki, Tokyo (JP); Koichi Ikeda, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 159 days.

(21) Appl. No.: 14/161,914

(22) Filed: Jan. 23, 2014

(65) Prior Publication Data

US 2014/0235102 A1    Aug. 21, 2014

(30) Foreign Application Priority Data

Feb. 19, 2013  (JP) .................................. 2013-030402

(51) Int. Cl.
| | | |
|---|---|---|
| H02G 15/02 | (2006.01) | |
| H01R 13/6599 | (2011.01) | |
| H01P 3/08 | (2006.01) | |
| H01P 3/12 | (2006.01) | |
| H05K 1/02 | (2006.01) | |

(52) U.S. Cl.
CPC ............ H01R 13/6599 (2013.01); H01P 3/085 (2013.01); H01P 3/121 (2013.01); H05K 1/0219 (2013.01); *H05K 2201/0715* (2013.01); *H05K 2201/09336* (2013.01); *H05K 2201/09618* (2013.01)

(58) Field of Classification Search
CPC ..................... H05K 1/0219; H05K 2201/0715; H05K 2201/09336; H05K 2201/09618; H01R 13/6599; H01R 3/085; H01R 3/121

USPC ....................... 174/74 R, 78, 84 R, 84 C, 88 C
See application file for complete search history.

(56) References Cited

U.S. PATENT DOCUMENTS

| | | | | |
|---|---|---|---|---|
| 6,179,627 B1 * | 1/2001 | Daly | ................. | H01R 13/6658 439/354 |
| 7,544,066 B1 * | 6/2009 | Lynch | .................. | H01R 12/592 439/496 |
| 7,677,927 B2 * | 3/2010 | Hermant | ............ | H01R 13/6474 439/607.46 |
| 8,052,430 B2 * | 11/2011 | Wu | ........................ | H01R 9/032 439/76.1 |
| 2004/0115988 A1 * | 6/2004 | Wu | ........................ | H01R 12/62 439/497 |
| 2008/0250175 A1 * | 10/2008 | Sheafor | ............... | G06F 13/4286 710/100 |
| 2010/0014598 A1 * | 1/2010 | Pfeifer | ................ | G06F 13/4045 375/257 |
| 2010/0248544 A1 * | 9/2010 | Xu | ...................... | H01R 13/6594 439/607.04 |
| 2011/0061933 A1 * | 3/2011 | Prest | ..................... | H01R 23/662 174/75 R |
| 2011/0312219 A1 * | 12/2011 | Siahaan | ............... | H01R 13/504 439/625 |
| 2012/0000703 A1 * | 1/2012 | Kim | .................. | H01R 13/6592 174/70 R |
| 2012/0028495 A1 * | 2/2012 | Su | ........................... | H01R 9/03 439/449 |

FOREIGN PATENT DOCUMENTS

JP    2006-165951    6/2006

* cited by examiner

*Primary Examiner* — William H Mayo, III
(74) *Attorney, Agent, or Firm* — Chip Law Group

(57) ABSTRACT

A signal transmission cable has a cable including a dielectric layer and a metallic layer. The signal transmission cable further includes a connector having a chip with a terminal. The connector includes a substrate having an organic layer, and a portion of the organic layer extends from the substrate so as to form the dielectric layer of the cable. The metallic layer is located on the dielectric layer and is directly connected to the terminal.

30 Claims, 13 Drawing Sheets

_US 9,362,683 B2_

SIGNAL TRANSMISSION CABLE

CROSS REFERENCE TO RELATED APPLICATIONS

This application claims the benefit of Japanese Priority Patent Application JP 2013-030402 filed Feb. 19, 2013, the entire contents of which are incorporated herein by reference.

BACKGROUND

The present technology relates to a signal transmission cable, particularly to a signal transmission cable that can realize high-quality, high-speed communication without increasing mounting space for the cable.

In recent years, the functions of a mobile phone, a smart phone, a notebook computer, a digital camera and the like have been remarkably improved, and a high resolution and high definition of a display element or an image pickup element built in these electronic devices have been demanded, and thus these electronic devices have been increasingly complicated.

In particular, in a mobile phone, a smart phone or the like, built-in camera functions, an enlargement of a display unit, high-functionality, weight reduction and downsizing, and low electric power consumption have been demanded.

In the related art, any number of signal lines used to transmit and receive signals in a device has been provided in parallel, but efforts to reduce the number of signal lines are made in association with the weight reduction and downsizing of the device.

For example, it is considered that parallel to serial conversion and serial to parallel conversion are performed and data are serialized to be transmitted so as to reduce the number of signal lines, but transmission capacity per signal line is already exceeded due to a demand for a high-speed transmission associated with complexities of recent devices.

It is proposed that a modulation circuit is provided in such a manner that a specific frequency band of signals to be transmitted is lowered and characteristic flat portions of a transmission path can be used and that entire data to be transmitted are serialized to be transmitted (for example, refer to Japanese Unexamined Patent Application Publication No. 2006-165951).

SUMMARY

Japanese Unexamined Patent Application Publication No. 2006-165951 does not offer more than the disclosure of a circuit configuration and exemplifies only a few specific technologies, and thus it is difficult to ensure signal integrity (SI).

In addition, since many substrate designers are not specialists in serial transmission, it is hard to say that communication capacity can be widely and generally improved according to Japanese Unexamined Patent Application Publication No. 2006-165951.

In addition, since communication speed improvement is necessary for coping with an increase in the amount of data handled by electronic devices and a tendency of a carrier-frequency becoming high proceeds, a degree of difficulty in designing a physical layer from a transceiver to a receiver is increased. For example, in design of such a physical layer, high technology capabilities are necessary similarly to the acquirement of low skew and low simultaneous switching noise in parallel communication.

Furthermore, a high frequency carrier-specific noise problem occurs. In general, a cable capable of transmitting a high frequency is rigid and large in the volume of wires. Wires are not provided on a substrate; instead, the cable has an increased volume of wires and a mounting space for the cable becomes large. For this reason, it is practically difficult to mount the cable on a mobile device and the like.

It is desirable to realize high-quality, high-speed communication without increasing a mounting space for a cable.

In one exemplary aspect of the present technology, there is disclosed a signal transmission cable, comprising: a cable including a dielectric layer and a metallic layer; and a connector having a chip with a terminal, the connector including a substrate having an organic layer, a portion of the organic layer extending from the substrate so as to form the dielectric layer of the cable, the metallic layer being located on the dielectric layer and being directly connected to the terminal.

In another exemplary aspect of the present technology, there is disclosed a connector for a signal transmission cable, the connector comprising: a chip including a terminal; and a substrate including an organic layer, a portion of the organic layer extending from the substrate so as to form a dielectric layer of a cable, a metallic layer being located on the dielectric layer and being directly connected to the terminal.

In yet another exemplary aspect of the present technology, there is disclosed a substrate for a connector of a signal transmission cable, the substrate comprising: an organic layer, a portion of the organic layer extending from the substrate so as to form a dielectric layer of a cable; and a metallic layer located on the dielectric layer and being configured for direct connection to a terminal of a chip.

According to the present technology, high-quality, high-speed communication can be realized without increasing a mounting space for the cable.

DETAILED DESCRIPTION OF EMBODIMENTS

Hereinafter, an embodiment of the technology disclosed here will be described with reference to the accompanying drawings.

Figure 1:
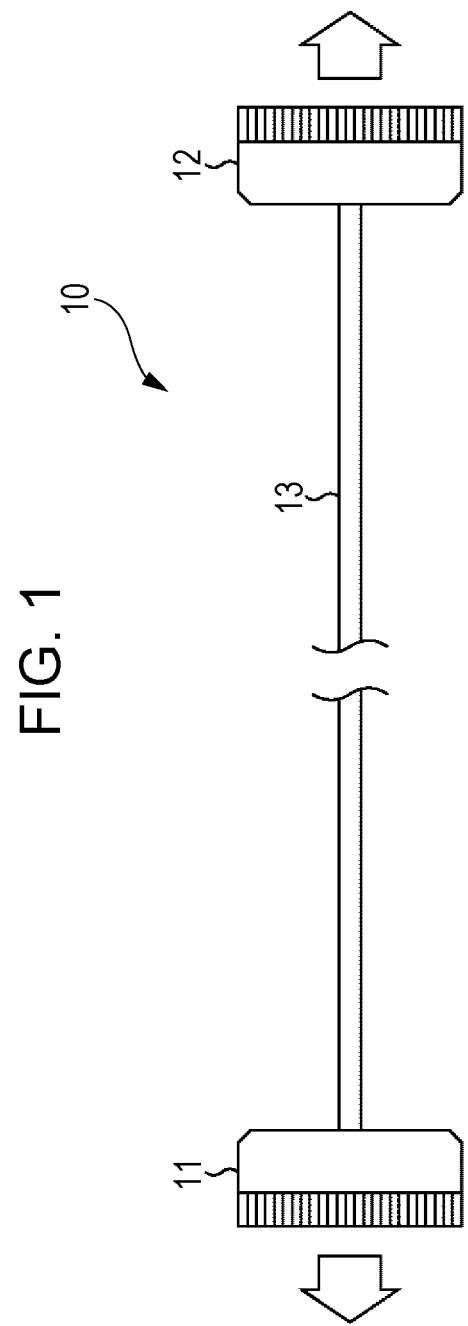
FIG. 1 illustrates an example of an exterior configuration of a flexible flat cable according to an embodiment of the present technology.

FIG. 1 illustrates an example of an exterior configuration of a flexible flat cable 10 according to an embodiment of the present technology.

As illustrated in FIG. 1, the flexible flat cable 10 is configured to connect a transmission side connector 11 and a receiving side connector 12 via a cable 13.

For example, the flexible flat cable 10 is used as a cable to connect substrates to each other in electronic devices such as a mobile phone, a smart phone, a notebook computer and a digital camera.

For example, the transmission side connector 11 is connected to a substrate of an image sensor module in a smart phone, and the receiving side connector 12 is connected to a substrate of a signal processing module in the smart phone. In addition, the cable 13 is formed of a material which can be simply bent. For example, the cable 13 is freely bent depending on the arrangement of substrates in the smart phone.

Figure 2:
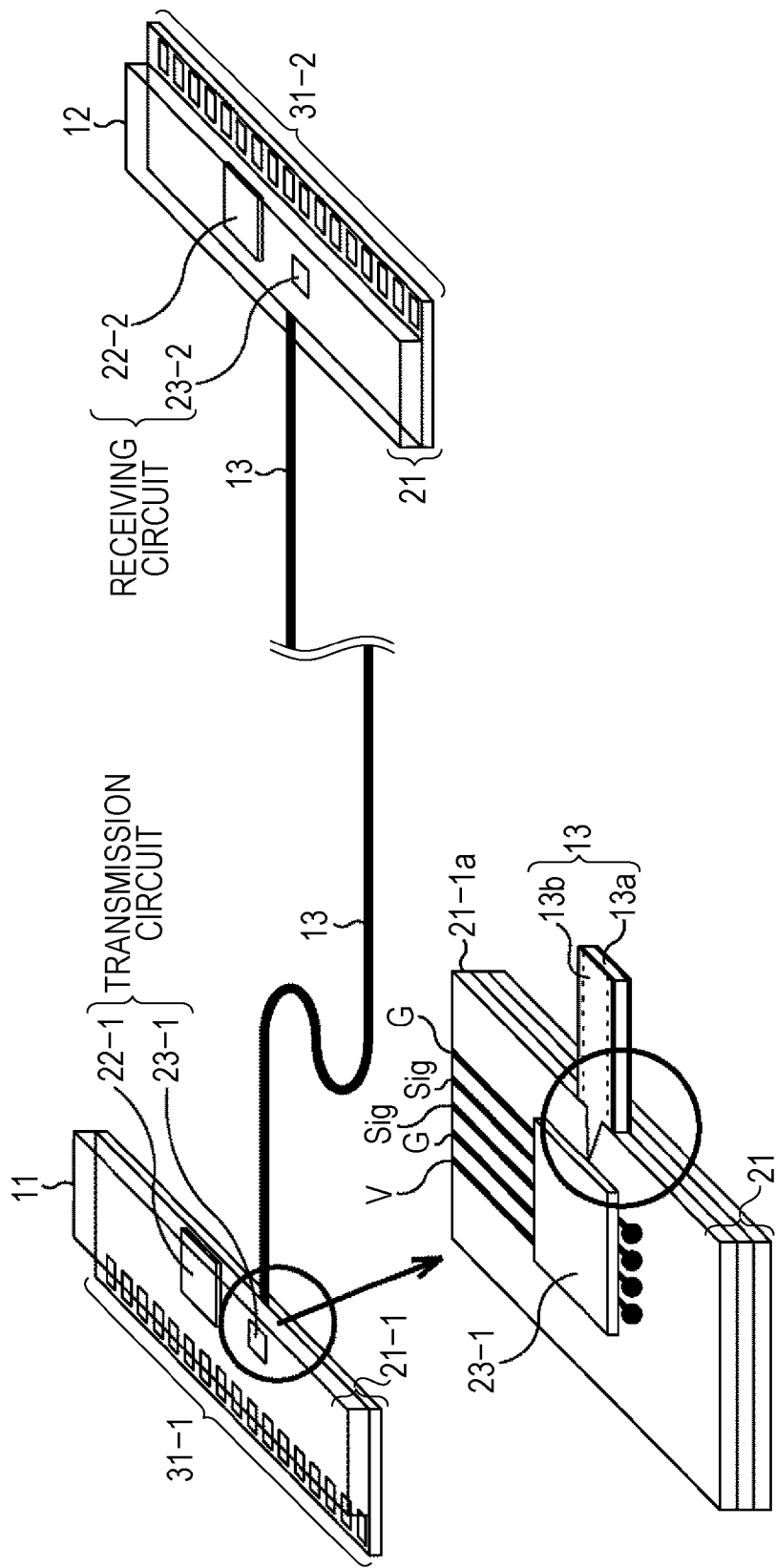
FIG. 2 illustrates internal configurations of a transmission side connector and a receiving side connector.

FIG. 2 illustrates internal configurations of the transmission side connector 11 and the receiving side connector 12.

As illustrated in FIG. 2, the transmission side connector 11 is configured to have a BB chip 22-1 and a RF chip 23-1 arranged on an organic multilayer substrate 21-1. The transmission side connector 11 has an input terminal 31-1 provided in a portion (left side in FIG. 2) which is connected to the substrate.

For example, the input terminal 31-1 is configured to have a plurality of metallic terminals arranged in parallel, and signal voltages, which are output from the substrate where the transmission side connector 11 is connected, are applied to each terminal, respectively. For example, when the input terminal 31-1 has 20 pieces of the metallic terminals arranged, a maximum of 20 types of signals are input to the transmission side connector 11 in parallel.

The organic multilayer substrate 21-1 is configured to have at least one layer of organic substrates, and each of the organic substrates has flexibility different from a glass substrate, a ceramic substrate and the like.

The BB chip 22-1 converts each of the plurality of signals (parallel signals), which are input in parallel via the input terminal 31-1, to signals in series (serial signals). The BB chip 22-1 outputs the converted serial signals to the RF chip 23-1. For example, since the serial signals are transmitted as differential signals, two serial signals with reverse phases are generated to be output by the BB chip 22-1.

The RF chip 23-1 modulates the serial signals output from the BB chip 22-1 by means of a carrier (carrier wave). Accordingly, the baseband-frequency serial signals are modulated to a carrier-frequency of a high-frequency signal.

An enlarged view on a lower side of FIG. 2 illustrates the vicinity of the RF chip 23-1 of the transmission side connector 11. As illustrated in the enlarged view, a power supply (V) wire, ground (G) wires and signal (Sig) wires are connected to the RF chip 23-1. In this example, the wires are connected to the RF chip 23-1 in a sequence of the power supply, the ground, the signal and the ground from the left of the enlarged view. Two signal wires transmit two serial signals output from the BB chip 22-1 as differential signals.

In addition, for example, as illustrated in the enlarged view, the cable 13 forms a dielectric layer 13a with an organic substrate 21-1a which is one layer of the organic multilayer substrate 21-1 and has the RF chip 23-1 directly attached thereto. That is, the cable 13 is configured to share the dielectric layer 13a with the organic substrate 21-1a of the organic multilayer substrate 21-1 of the transmission side connector 11.

In addition, a metallic layer 13b is provided on the dielectric layer 13a in the cable 13. A signal output terminal of the RF chip 23-1 is connected to the metallic layer 13b. That is, the metallic layer 13b is directly connected to the output terminal for the high-frequency signal output from the RF chip 23-1. In other words, the metallic layer 13b of the cable 13 is seamlessly connected to the output terminal of the RF chip 23-1 for the high-frequency signal.

Herein, connecting locations between the transmission side connector 11 and the cable 13 are illustrated, but connecting locations between the receiving side connector 12 and the cable 13 are formed in the same way. That is, the cable 13 is configured to share the dielectric layer 13a with an organic substrate of the organic multilayer substrate of the receiving side connector 12, and the metallic layer 13b is directly connected to an input terminal of a RF chip 23-2 for the high-frequency signal.

In practicality, the cable 13 is configured to use the dielectric layer 13a and the metallic layer 13b as signal lines and, for example, to shield the signal lines with a protective member such as a resin.

In this example, the cable 13 has a substrate integrated waveguide (SIW) structure. The SIW is a structure that has a dielectric layer inserted between two metallic layers and through holes formed in both side surfaces of a cable in the longitudinal direction. In FIG. 2, a plurality of small circles are displayed in parallel on both side surfaces of the metallic layer 13b of the cable 13, and these circles represent the through holes. In addition, a planar metallic layer is provided even on the lower side of the cable to have the dielectric layer 13a interposed. The SIW structure will be described in detail later.

In addition, as illustrated in FIG. 2, the receiving side connector 12 is configured to have a BB chip 22-2 and a RF chip 23-2 arranged on an organic multilayer substrate 21-2. The receiving side connector 12 has an output terminal 31-2 provided in a portion (right side in FIG. 2) which is connected to the substrate.

The RF chip 23-2 demodulates the high-frequency signal transmitted via the cable 13. Accordingly, the carrier-frequency of the high-frequency signal is demodulated to the baseband-frequency serial signals. At this time, as described above, two serial signals with reverse phases are generated. The serial signals are output to the BB chip 22-2.

The BB chip 22-2 converts the serial signals, which are output from the RF chip 23-2, to the parallel signals, thereby generating the same signals as the parallel signals input to the BB chip 22-1 on the transmission side.

For example, the output terminal 31-2 is configured to have a plurality of metallic terminals arranged in parallel, and signal voltages, which are input to the substrate where the receiving side connector 12 is connected, are applied to each terminal, respectively. The number of the metallic terminals arranged in the output terminal 31-2 is the same as the number of the metallic terminals arranged in the input terminal 31-1. The signal voltages applied to the plurality of metallic terminals of the input terminal 31-1 are reproduced in the plurality of metallic terminals of the output terminal 31-2, respectively.

The flexible flat cable 10, to which the present technology is applied, has such a configuration. As described above, the cable 13 is configured to share the dielectric layer 13a with the organic substrate 21-1a of the organic multilayer substrate 21-1 of the transmission side connector 11, and the metallic layer 13b is seamlessly connected to the output terminal of the RF chip 23-1 for the high-frequency signal. In this way, for example, noise, which is generated when the high-frequency signal is reflected in a connecting portion between the transmission side connector 11 and the cable 13, can be suppressed and signal integrity (SI) can be improved.

Figure 3:
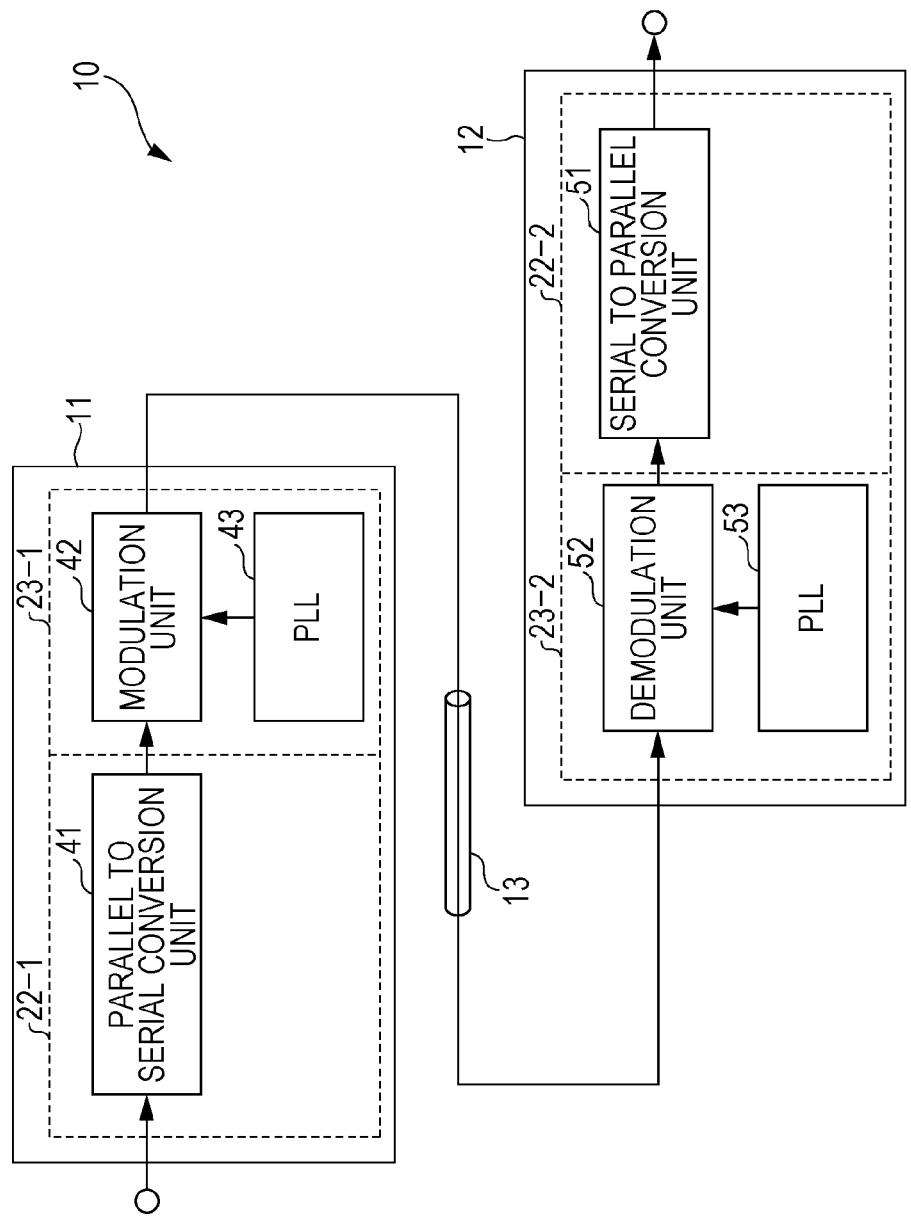
FIG. 3 is a block diagram illustrating an example of a functional configuration of the flexible flat cable to which the present technology is applied.

FIG. 3 is a block diagram illustrating an example of a functional configuration of the flexible flat cable 10 to which the present technology is applied.

As illustrated in FIG. 3, the transmission side connector 11 has a parallel to serial conversion unit 41 that converts parallel signals to serial signals; a modulation unit 42 that modulates the serial signals by means of a carrier wave; and a PLL 43 that generates a carrier-frequency signal. The parallel to serial conversion unit 41 is realized by a function of the BB chip 22-1, and the modulation unit 42 and the PLL 43 are realized by a function of the RF chip 23-1.

In addition, as illustrated in FIG. 3, the receiving side connector 12 has a serial to parallel conversion unit 51 that converts serial signals to parallel signals; a demodulation unit 52 that demodulates the high-frequency signal to basebandfrequency serial signals; and a PLL 53 that generates carrier-frequency signals. The serial to parallel conversion unit 51 is realized by a function of the BB chip 22-2, and the demodulation unit 52 and the PLL 53 are realized by a function of the RF chip 23-2.

Figure 4:
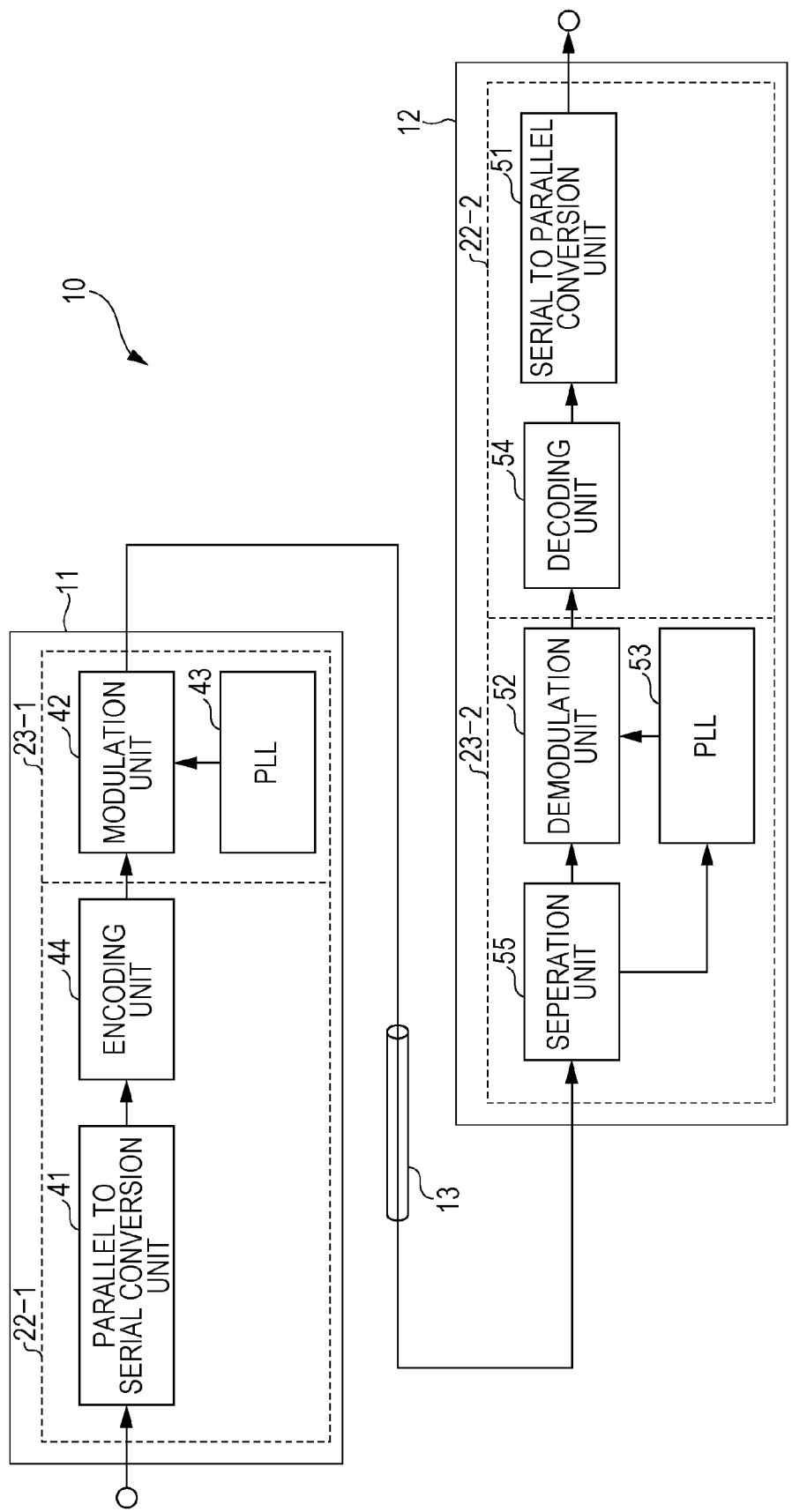
FIG. 4 is a block diagram illustrating another example of the functional configuration of the flexible flat cable to which the present technology is applied.

In addition, the flexible flat cable 10 may be configured as illustrated in FIG. 4. FIG. 4 is a block diagram illustrating another example of the functional configuration of the flexible flat cable 10 to which the present technology is applied.

A configuration of FIG. 4 has an encoding unit 44 provided in the transmission side connector 11 differently from the configuration of FIG. 3. For example, the encoding unit 44 encodes the serial signals output from the parallel to serial conversion unit 41 by means of 8b/10b conversion. In addition, the configuration of FIG. 4 has a decoding unit 54 provided in the receiving side connector 12 differently from the configuration of FIG. 3. The decoding unit 54 decodes the signals output from the demodulation unit 52 by means of inversion of the 8b/10b conversion.

As illustrated in FIG. 4, when the encoding unit 44 and the decoding unit 54 are provided, a transmission band can be effectively utilized and a bit error rate of data, which are transmitted from the transmission side substrate to the receiving side substrate, can be reduced. Accordingly, SI of the transmitted signals is further improved.

In addition, the configuration of FIG. 4 has a separation unit 55 provided in the receiving side connector 12 differently from the case of FIG. 3. The separation unit 55 separates only carrier wave components from the high-frequency signal transmitted via the cable 13 to supply the resultant signal to the PLL 53.

As illustrated in FIG. 4, the separation unit 55 is provided and thus the demodulation unit 52 can perform a demodulation exactly in synchronization with the frequency of the signal generated by the PLL 43 of the transmission side connector. Accordingly, SI of the transmitted signal is further improved.

The other configurations in FIG. 4 are the same as the configurations described above with reference to FIG. 3.

As such, since SI can be improved according to the flexible flat cable 10 to which the present technology is applied, for example, the cable 13 longer than the related art can be adopted with transmission quality being maintained. In addition, according to the flexible flat cable 10 to which the present technology is applied, for example, electric power consumption in the signal transmission can be further reduced or a larger amount of data can be handled.

In addition, since processing of the generation, demodulation and the like of the high-frequency signal is completed in the flexible flat cable 10, for example, even engineers deficient in knowledge of or experience in the high-frequency signal can easily design the circuits of electronic devices.

In the embodiment described above, one high-frequency signal is transmitted via the cable 13. That is, one serial signal (but, in practicality, two serial signals since the serial signals are transmitted as differential signals) is generated from parallel signals which are formed of a same number (for example, 20) of signals as a number of the terminals arranged in the input terminal 31-1 or the output terminal 31-2. The serial signals are modulated to a high-frequency signal to be transmitted.

However, for example, a plurality of high-frequency signals may be transmitted via the cable 13. For example, a first serial signal may be generated from parallel signals formed of ten signals and a second serial signal may be generated from parallel signals formed of the other ten signals. These serial signals may be modulated to a high-frequency signal to be multiplexed and transmitted.

In this case, for example, it is preferred that a carrier frequency at the time of modulating the first serial signal be different from a carrier frequency at the time of modulating the second serial signal. In this case, for example, a millimeter wave, the frequency of which is 30 GHz to 300 GHz, is used as the carrier wave. In this way, for example, the serial signals can be modulated by a plurality of the carrier waves, the frequencies of which are sufficiently apart from each other, and interferences can be avoided when the signals are multiplexed on the cable 13.

Figure 5:
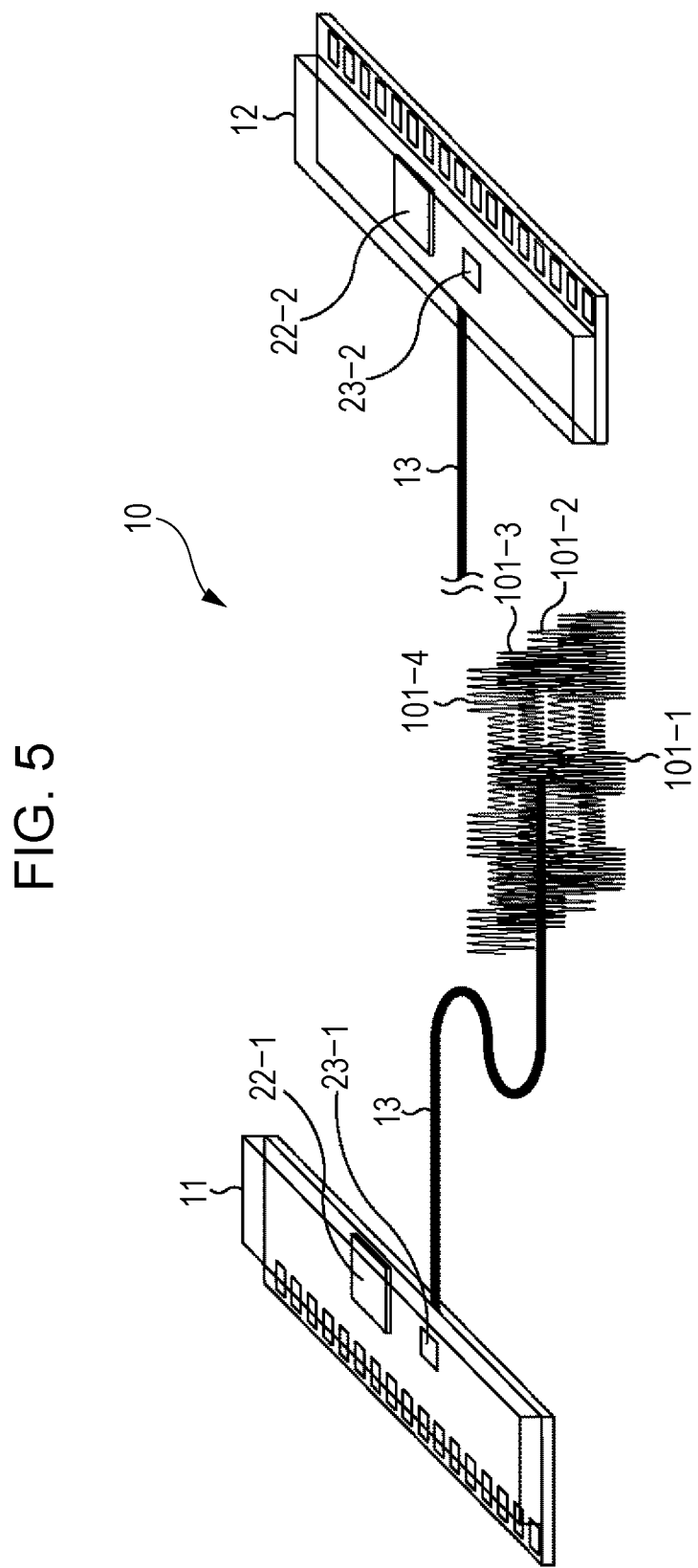
FIG. 5 illustrates an example where a plurality of signals are multiplexed on a cable.

For example, as illustrated in FIG. 5, it is preferred that a plurality of signals be multiplexed on the cable 13. An example of FIG. 5 illustrates a waveform 101-1 of a first serial signal modulated by a millimeter-wave carrier wave, a waveform 101-2 of a second serial signal modulated by a millimeter-wave carrier wave, a waveform 101-3 of a third serial signal modulated by a millimeter-wave carrier wave and a waveform 101-4 of a fourth serial signal modulated by a millimeter-wave carrier wave.

When a plurality of serial signals are modulated and multiplexed, it is preferred that a multiplexing unit be provided in the RF chip 23-1 of the transmission side connector 11 and a band-pass filter be provided in the RF chip 23-2 of the receiving side connector 12.

Figure 6:
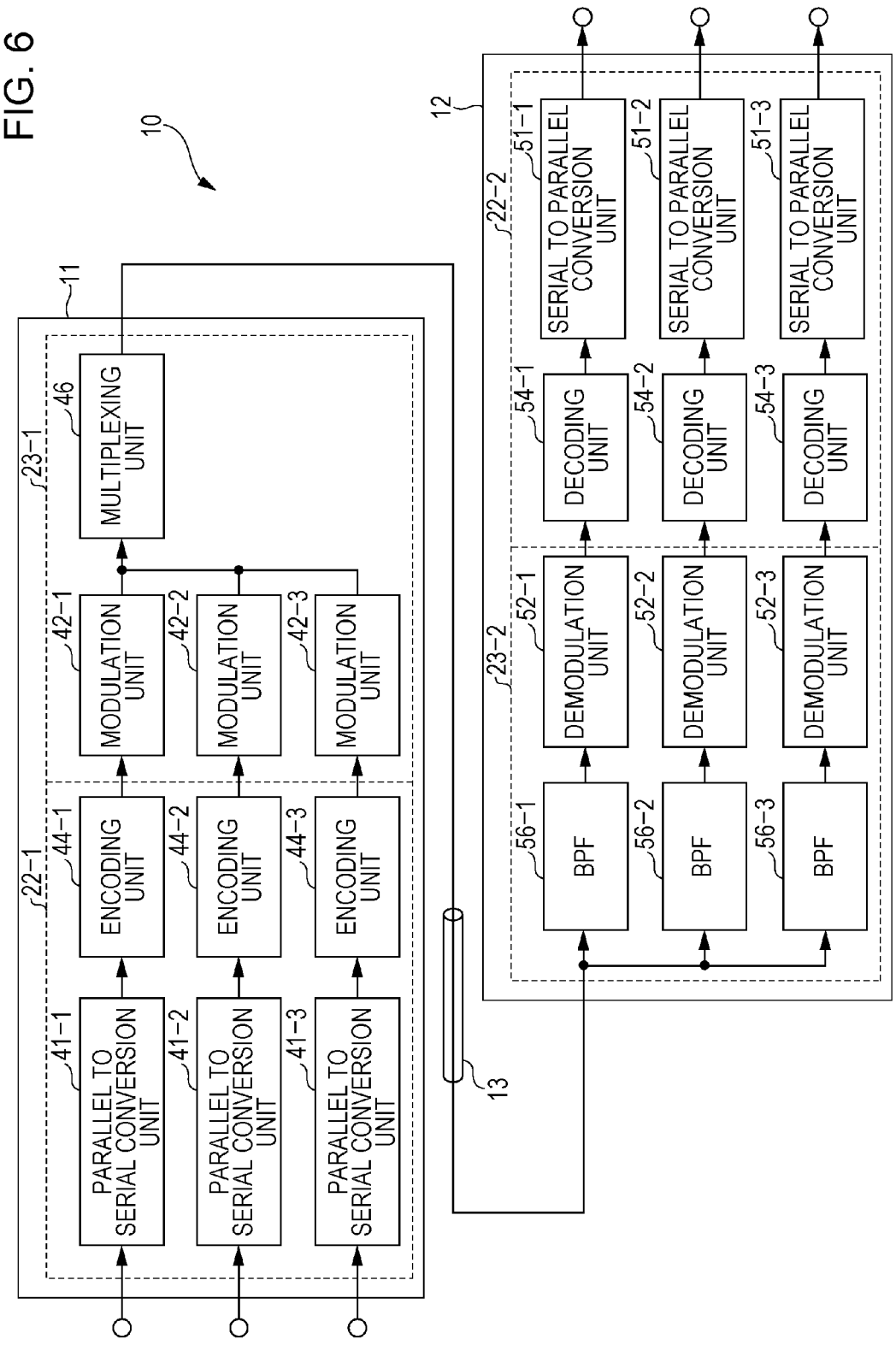
FIG. 6 is a block diagram illustrating yet another example of the functional configuration of the flexible flat cable to which the present technology is applied.

FIG. 6 is a block diagram illustrating yet another example of the functional configuration of the flexible flat cable 10 illustrated in FIG. 5. In the configuration of FIG. 6, the first to third serial signals modulated by millimeter-wave carrier waves are multiplexed to be transmitted.

The example of FIG. 6 has parallel to serial conversion units 41-1 to 41-3; encoding units 44-1 to 44-3; modulation units 42-1 to 42-3; and a multiplexing unit 46 provided in the transmission side connector 11. The parallel to serial conversion units 41-1 to 41-3 and the encoding units 44-1 to 44-3 are realized by the function of the BB chip 22-1, and the modulation units 42-1 to 42-3 and the multiplexing unit 46 are realized by the function of the RF chip 23-1.

Each of the parallel to serial conversion units 41-1 to 41-3 converts parallel signals to serial signals. For example, the first serial signal is generated by the parallel to serial conversion unit 41-1, the second serial signal is generated by the parallel to serial conversion unit 41-2, and the third serial signal is generated by the parallel to serial conversion unit 41-3.

The encoding units 44-1 to 44-3 encode the first to third serial signals output from the parallel to serial conversion units 41-1 to 41-3, respectively, by means of 8*b*/10*b* conversion.

The modulation units 42-1 to 42-3 modulate the encoded first to third serial signals output from the encoding units 44-1 to 44-3, respectively, by means of carrier waves. In FIG. 6, a PLL generating a carrier-frequency signal is not illustrated, but first to third carrier-wave signals, the frequencies of which are millimeter-wave bands of frequencies and different from each other, are supplied to the modulation units 42-1 to 42-3, respectively.

The multiplexing unit 46 multiplexes the modulated first to third serial signals output from the modulation units 42-1 to 42-3 and generates high-frequency signals.

In addition, the example of FIG. 6 has serial to parallel conversion units 51-1 to 51-3; decoding units 54-1 to 54-3; demodulation units 52-1 to 52-3; and band-pass filters (BPFs) 56-1 to 56-3 provided in the receiving side connector 12. The serial to parallel conversion units 51-1 to 51-3 and the decoding units 54-1 to 54-3 are realized by the function of the BB chip 22-2, and the demodulation units 52-1 to 52-3 and the BPFs 56-1 to 56-3 are realized by the function of the RF chip 23-2.

Each of the BPFs 56-1 to 56-3 extracts certain frequency components from the received high-frequency signals. Accordingly, for example, the frequency components corresponding to the first to third carrier-wave signals are extracted, respectively. Accordingly, the signals multiplexed by the multiplexing unit 46 are separated.

The demodulation units 52-1 to 52-3 demodulate signals of the respective frequency components, which are output from the BPFs 56-1 to 56-3, to baseband-frequency serial signals, respectively. In FIG. 6, a PLL generating a carrier-frequency signal is not illustrated, but the first to third carrier-wave signals, the frequencies of which are millimeter-wave band of frequencies and different from each other, are supplied to the demodulation units 52-1 to 52-3, respectively.

The decoding units 54-1 to 54-3 decode the signals output from the demodulation units 52-1 to 52-3 by means of reverse inversion of the 8*b*/10*b* conversion.

The serial to parallel conversion units 51-1 to 51-3 convert the serial signals, which are output from the decoding units 54-1 to 54-3, to the parallel signals.

When a configuration is made as illustrated in FIG. 6, a plurality of serial signals can be multiplexed and transmitted via a single cable 13. In this way, for example, more signals can be parallelized, and a much larger amount of data (for example, 10 Gbps or higher) can be transmitted.

The carrier wave preferably has a frequency of 30 GHz to 300 GHz to set a transmission capacity to 10 Gbps or higher.

Figure 7:
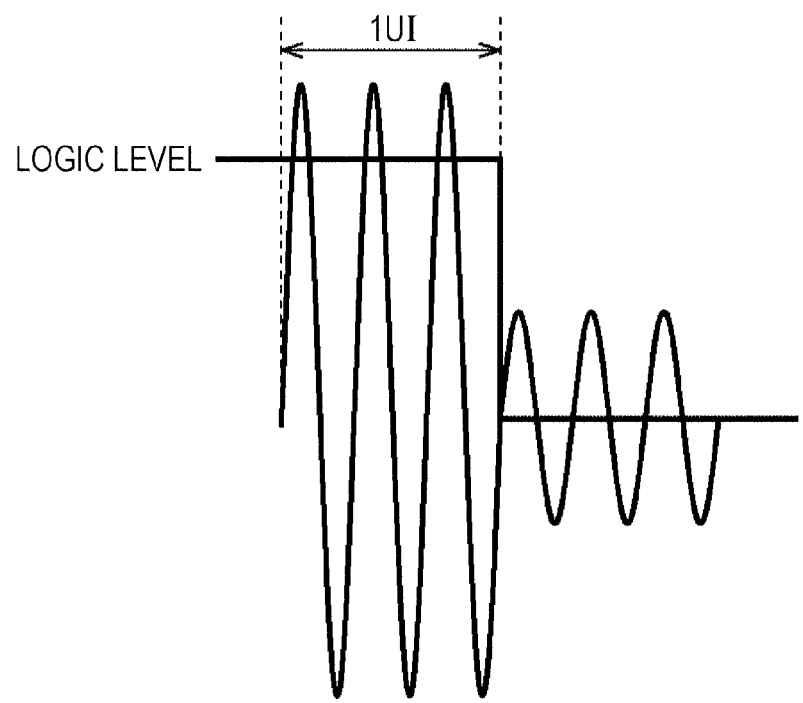
FIG. 7 illustrates a logic level in one UI.

An amplitude shift keying (ASK) modulation is typically used as a modulation in the transmission side connector 11. For example, as illustrated in FIG. 7, the ASK-modulated signal preferably has three or more points of logic levels in one unit interval (UI) to maintain good SI. The reason is that it is difficult to increase reliability of data recovery when sampling points are equal to or less than 2 points.

In FIG. 7, a horizontal axis and a vertical axis represent time and signal level, respectively, and the amplitude of a waveform of the high-frequency signal is illustrated. In an example of FIG. 7, a three-period signal is used to determine a logic level ("0" or "1"). In this case, a carrier frequency of 30 GHz or higher is necessary to transmit a baseband signal at 10 Gbps.

In addition, a practical limit of the carrier frequency is currently in a range of 300 GHz. For example, the reason is that it is difficult to realize electrical wire materials or low loss-achievable technologies which can cope with a region exceeding 300 GHz.

In addition, for example, a transmission path when 30 GHz to 300 GHz of a millimeter-wave band of the carrier frequency is used can have a narrower width and a thinner thickness than a transmission path when a flexible flat cable in the related art is used, and a minimum bending radius can be reduced.

A metallic layer thickness necessary for a transmission path for the high-frequency signal becomes thinner with an increase in a frequency due to skin effect. For example, for a copper wire, a skin thickness is in a range of 0.4 μm at 30 GHz and thus it is preferred that a metallic layer thickness be 0.8 μm. Accordingly, in a carrier-frequency region according to the present technology, a transmission path for a multiplexed high-frequency signal can be designed to have a metallic layer thickness of 1 μm or smaller. As described above, since the dielectric layer 13*a* of the cable 13 is formed of the same flexible material as the organic substrate, flexibility of the cable 13 can be increased as much as the thickness of the metallic layer 13*b* is made thin.

In the present technology, since a millimeter-wave band of carrier frequency is used, the thickness of the metallic layer 13*b* can be designed to be 1 μm or less, and high flexibility can be acquired.

In addition, for example, when the substrate integrated waveguide (SIW) structure is adopted as a structure of the signal lines of the cable 13 to realize high electro-magnetic compatibility (EMC), an outline size of the cable is determined by the lowest multiplexed frequency (the longest wavelength). For this reason, the outline size of the cable can be reduced as much as the carrier frequency is increased.

In the present technology, since a millimeter-wave band of carrier frequency is used, the outline size of the cable (cable width) can be reduced.

In addition, the dielectric layer 13*a* is preferably formed of a material with a sufficiently low dielectric constant and low dielectric loss to realize a maximum transmission capacity via the flexible flat cable 10. As described above, since the dielectric layer 13*a* of the cable 13 is configured to be shared by the organic substrate 21-1*a* of the organic multilayer substrate 21-1 of the transmission side connector 11, it is also necessary for the organic substrate 21-1*a* of the organic multilayer substrate 21-1 to be formed of the same material as the dielectric layer 13*a*.

For example, since a group of materials called liquid crystal polymers (LCPs) have a low dielectric constant and low dielectric loss and are materials excellent in flexibility, the materials are considered to be suitable for a material of the dielectric layer 13*a*. For example, in the 3000 series manufactured by Rogers Inc., Bexter manufactured by Kuraray Inc. and the like, there are abundant classes of materials and manufacturing process developments are advanced, and thus the materials are considered to be for mass production.

Figure 8A:
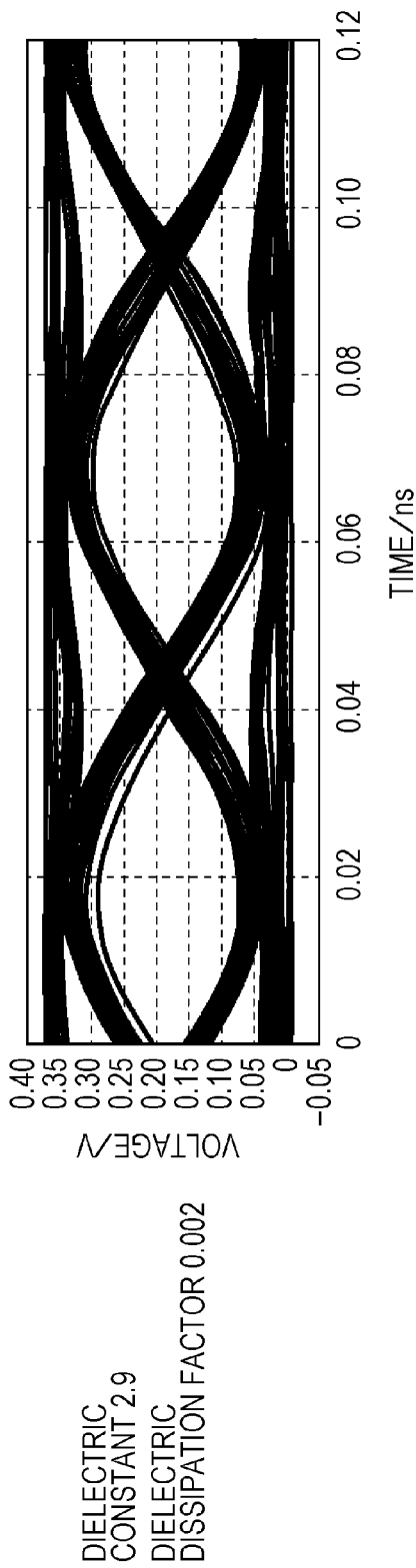
FIGS. 8A and 8B illustrate examples of eye patterns when a transmission is performed via the flexible flat cable.
Figure 8B:
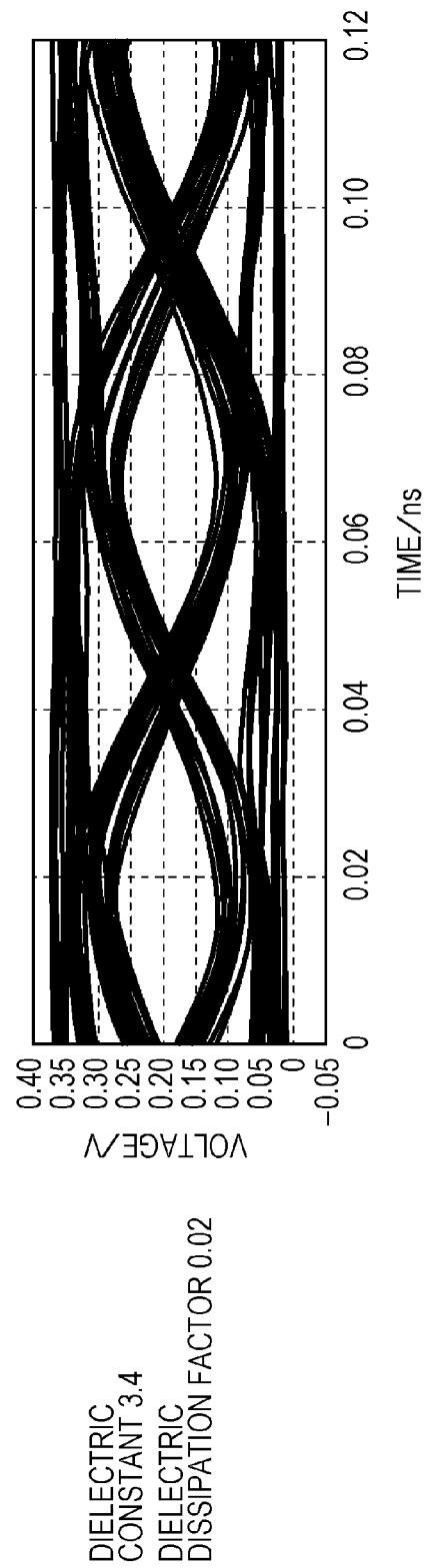

FIGS. 8A and 8B illustrate examples of eye patterns when a transmission is performed at 10 Gbps via the flexible flat cable 10. FIG. 8A illustrates an eye pattern when LCP is used for a material of the dielectric layer 13*a*, and the dielectric constant of the LCP is 2.9 and the dielectric dissipation factor is 0.002. FIG. 8B illustrates an eye pattern when a polyamide (PI) is used for a material of the dielectric layer 13a, and the dielectric constant of the PI is 3.4 and the dielectric dissipation factor is 0.02.

Compared to FIG. 8B, the eye pattern of FIG. 8A has large openings and the LCP is used for a material of the dielectric layer 13a, and thus it is understood that SI can become good when a large amount of data is transmitted.

According to FIG. 8, a material of the dielectric layer 13a of the cable 13 in the flexible flat cable 10, to which the present technology is applied, preferably has the dielectric constant of less than 3.5 and the dielectric dissipation factor of less than 0.003.

There is also a transmission path between substrates in which not only a signal is transmitted but also a power supply is supplied. Even the flexible flat cable 10, to which the present technology applied, is preferably configured to include not only a signal line but also a power supply line. However, when the power supply line is arranged in the vicinity of the signal line transmitting a weak signal voltage, there is a concern that noise occur.

For example, as described above, since the substrate integrated waveguide (SIW) structure is adopted and thus the flexible flat cable 10 can realize high electro-magnetic compatibility (EMC), the flexible flat cable 10 can be configured to suppress the occurrence of noise and include a power supply line.

Figure 9A:
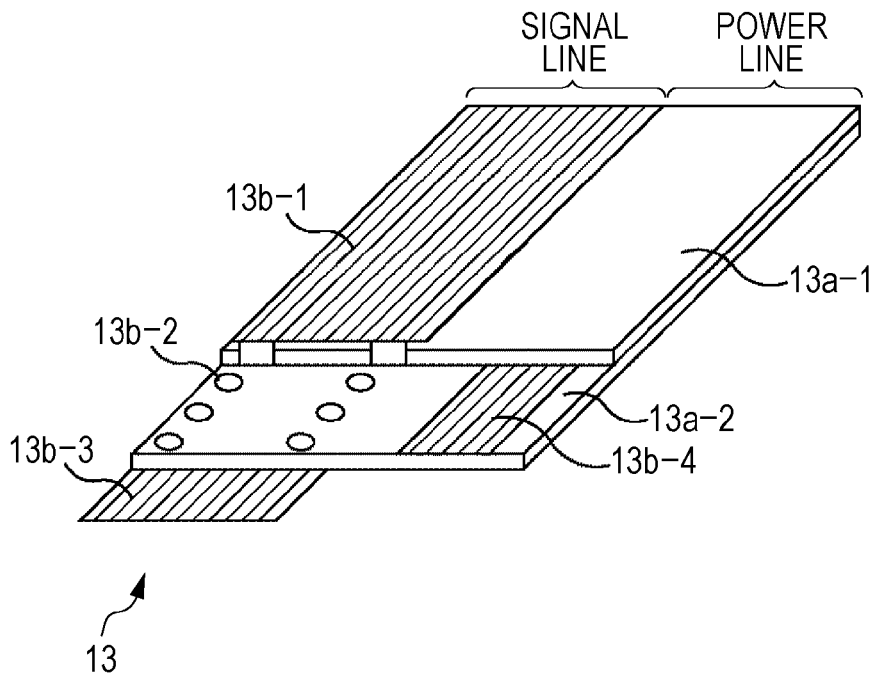
FIGS. 9A and 9B are cross-sectional views illustrating examples of a cable configuration in the flexible flat cable to which the present technology is applied.
Figure 9B:
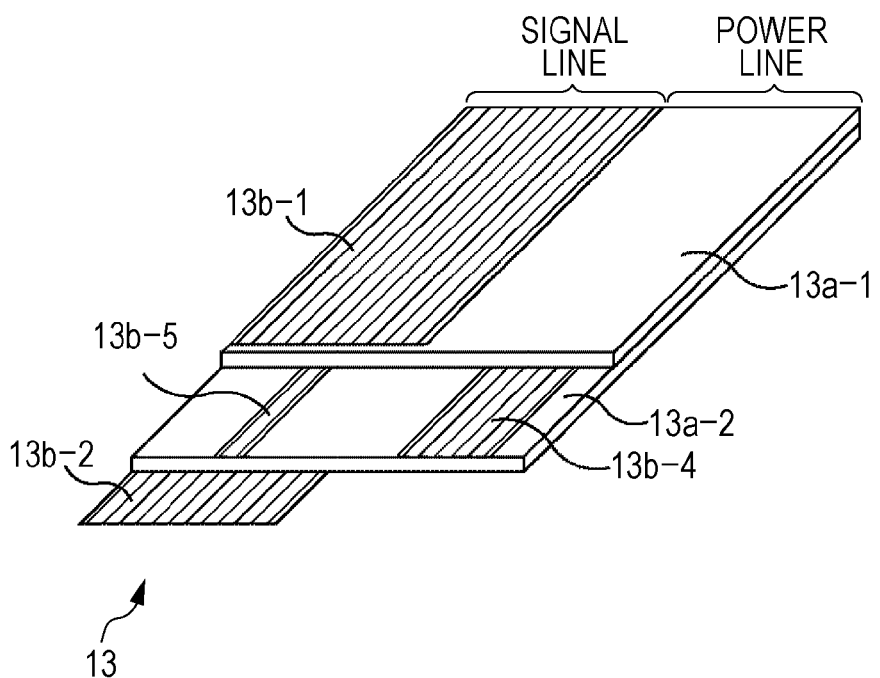

FIGS. 9A and 9B are cross-sectional views illustrating examples of a configuration of the cable 13 in the flexible flat cable 10 to which the present technology is applied.

FIG. 9A is a cross-sectional view of an example when the SIW structure is adopted for the cable 13. As illustrated in FIG. 9A, a left side of the cable 13 in FIG. 9A is a region for the signal line and a right side of the cable 13 in FIG. 9A is a region for the power supply line. In this case, the dielectric layers of the cable 13 are configured to have two layers of dielectric layers 13a-1 and 13a-2. The dielectric layers 13a-1 and 13a-2 are shared by organic substrates, which respectively configure the two layers in the organic multilayer substrate 21-1.

An upper GND 13b-1, a through hole (TH) 13b-2 and a lower GND 13b-3 are provided in the region for the signal line. In addition, a core wire of a power supply 13b-4 is provided in the region for the power supply line. In the configuration of FIG. 9A, the metallic layer 13b is formed of the upper GND 13b-1 to the core wire of the power supply 13b-4.

In the configuration of FIG. 9A, only the upper GND 13b-1 in the metallic layer 13b is directly connected to an output terminal of the RF chip 23-1 for the high-frequency signal. In other words, the upper GND 13b-1 in the metallic layer 13b of the cable 13 is seamlessly connected to the output terminal of the RF chip 23-1 for the high-frequency signal.

As illustrated in FIG. 9A, for example, since the SIW structure is adopted for the cable 13 and thus EMC performance equal to or higher than that of a coaxial cable can be acquired, the flexible flat cable 10 can suppress the occurrence of noise and include a power supply line.

In addition, a structure illustrated in FIG. 9B may be adopted. FIG. 9B is a cross-sectional view of an example when an SL structure is adopted for the cable 13. As illustrated in FIG. 9B, a left side of the cable 13 in FIG. 9B is a region for the signal line and a right side of the cable 13 in FIG. 9B is a region for the power supply line. In this case, the dielectric layers of the cable 13 are configured to have two layers of the dielectric layers 13a-1 and 13a-2. The dielectric layers 13a-1 and 13a-2 are shared by organic substrates, which respectively configure the two layers in the organic multilayer substrate 21-1.

In the configuration of FIG. 9B, the upper GND 13b-1, a core wire of a signal line 13b-5 and the lower GND 13b-3 are provided in the region for the signal line. In addition, the core wire of the power supply 13b-4 is provided in the region for the power supply line. In the configuration of FIG. 9A, the metallic layer 13b is formed of the upper GND 13b-1 to the core wire of signal line 13b-5.

For example, when such an SL structure as illustrated in FIG. 9B is adopted, EMC performance is deteriorated compared to when the SIW structure is adopted, but the flexible flat cable 10 can suppress the occurrence of noise and include a power supply line.

In the configuration of FIG. 9B, the upper GND 13b-1 is directly connected to an output terminal of the RF chip 23-1 for the high-frequency signal. In other words, the upper GND 13b-1 in the metallic layer 13b of the cable 13 is seamlessly connected to the output terminal of the RF chip 23-1 for the high-frequency signal. However, in the configuration of FIG. 9B, the core wire of signal line 13b-5 is not seamlessly connected to the output terminal of the RF chip 23-1 for the high-frequency signal.

Accordingly, for example, when the configuration of FIG. 9B is compared to the configuration of FIG. 9A, there is a high possibility that the high-frequency signal is reflected in the connecting portion between the transmission side connector 11 and the cable 13, and thus SI is slightly deteriorated.

The examples of FIGS. 9A and 9B illustrate configurations that the core wire of the power supply 13b-4 is formed of one piece, but a plurality of the core wires of the power supply may be provided to supply a plurality of voltages.

Figure 10:
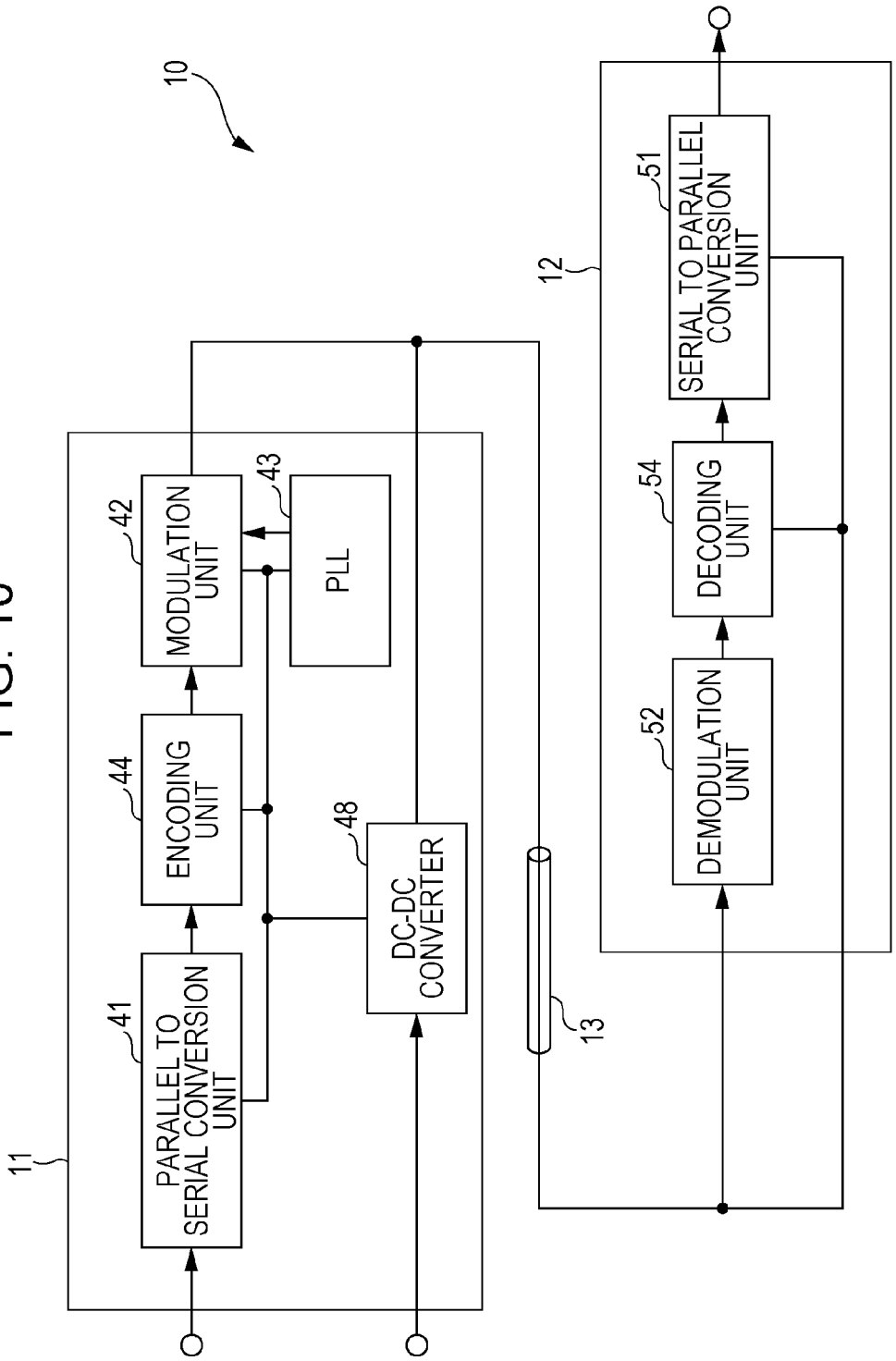
FIG. 10 is a block diagram illustrating still yet another example of the functional configuration of the flexible flat cable to which the present technology is applied.

FIG. 10 is a block diagram illustrating still yet another example of the functional configuration of the flexible flat cable 10 to which the present technology is applied.

In this example, the parallel to serial conversion unit 41, the modulation unit 42, the PLL 43, the encoding unit 44 and a DC-DC converter 48 are provided in the transmission side connector 11. In addition, the serial to parallel conversion unit 51, the demodulation unit 52 and the decoding unit 54 are provided in the receiving side connector 12.

The DC-DC converter 48 converts a direct current power supply voltage to a certain level of voltage. For example, the DC-DC converter 48 receives 5 V of power supply voltage to convert and output power supply voltages of 1.1 V, 1.3 V and 2.5 V. In addition, the DC-DC converter 48 supplies necessary power supply voltages to the parallel to serial conversion unit 41, the modulation unit 42, the PLL 43 and the encoding unit 44, respectively.

For example, 1.1 V, 1.3 V and 2.5 V of power supply voltages output from the DC-DC converter 48 are transmitted to the receiving side connector 12 via each of separate core wires of power supply and are supplied to the serial to parallel conversion unit 51, the demodulation unit 52 and the decoding unit 54, respectively.

At this time, for example, 1.1 V, 1.3 V and 2.5 V of power supply voltages are transmitted via the cable 13 that has a structure where three core wires of power supply are arranged and adopts the same configuration as described above with reference to FIG. 9A or 9B.

Figure 11:
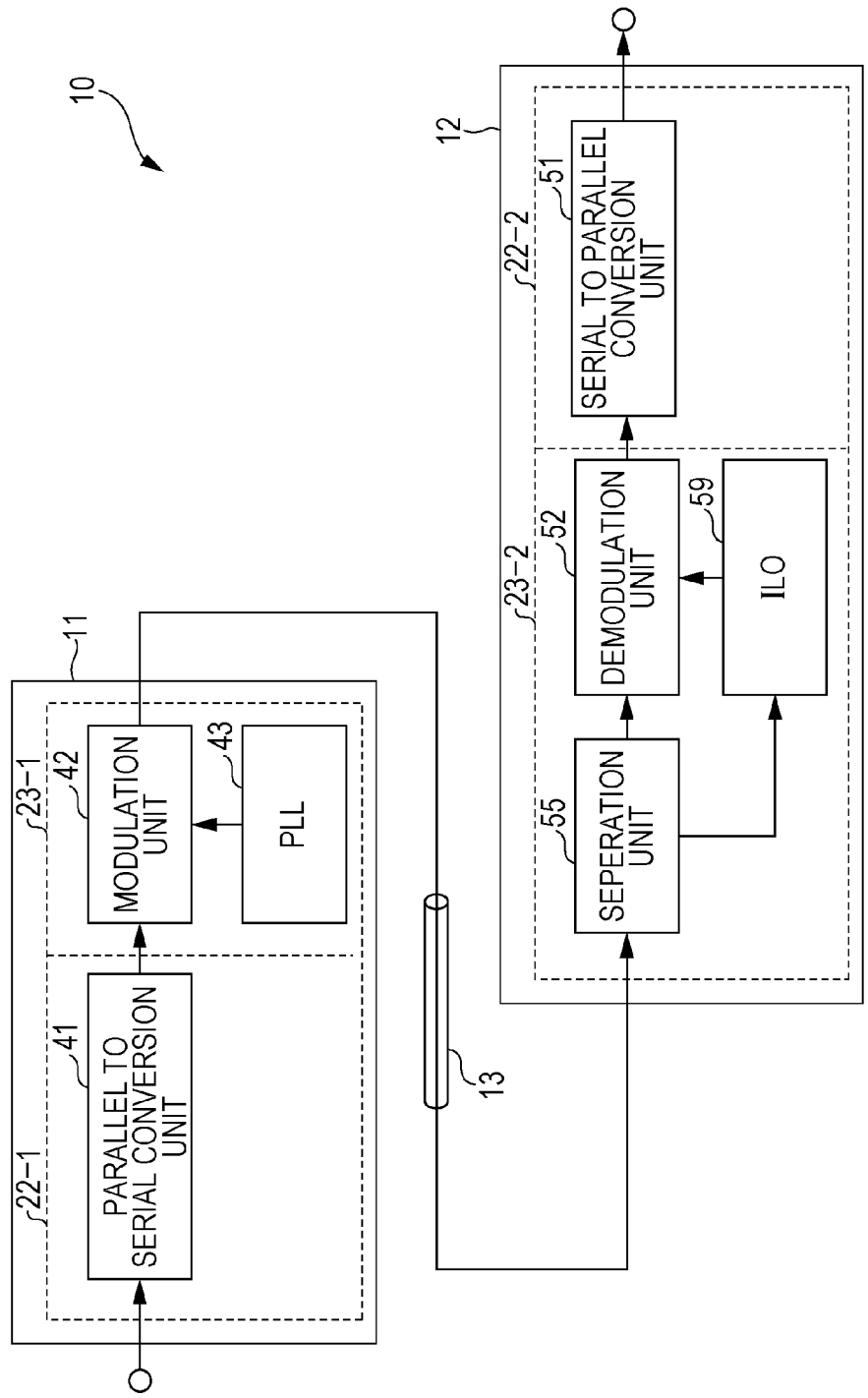
FIG. 11 is a block diagram illustrating still yet another example of the functional configuration of the flexible flat cable to which the present technology is applied.

FIG. 11 is a block diagram illustrating still yet another example of the functional configuration of the flexible flat cable 10 to which the present technology is applied.

In this example, the parallel to serial conversion unit 41, the modulation unit 42 and the PLL 43 are provided in the transmission side connector 11. The parallel to serial conversion unit 41 is realized by the function of the BB chip 22-1, and the modulation unit 42 and the PLL 43 are realized by the function of the RF chip 23-1. In addition, the serial to parallel conversion unit 51, the demodulation unit 52, the separation unit 55 and an injection lock (ILO) 59 are provided in the receiving side connector 12.

The ILO 59 generates a carrier-frequency signal in the receiving side connector 12 so that the ILO 59 can remove phase noise and generate a signal exactly synchronized with the frequency of the signal generated by the PLL 43 of the transmission side connector 11.

Such a configuration as illustrated in FIG. 11 is adopted, and thus consistency of clock frequency between transmission and receiving circuits is improved. In this way, for example, the consistency of the clock frequency between the transmission and receiving circuits can be improved without mounting a high-precision oscillator (PLL) in the receiving side connector 12. In addition, for example, in this way, a mounting area can be reduced compared to when a high-precision oscillator is mounted in the receiving side connector 12.

In the embodiments illustrated above, noise, which is generated when the high-frequency signal is reflected in the connecting portion between the transmission side connector (or receiving side connector 12) and the cable 13, can be suppressed and SI can be improved. Preferably, the output terminal of the RF chip 23-1 (or, input terminal of the RF chip 23-2) and a tip of the cable 13 are close to each other and arranged in a straight line. The reason is that, in this way, there is no return loss occurred at elbow-shaped bends of a metallic wire and SI improvement effects, which are acquired when the dielectric layer 13a is shared by a portion of the organic multilayer substrate 21-1, can be maximized.

Figure 12A:
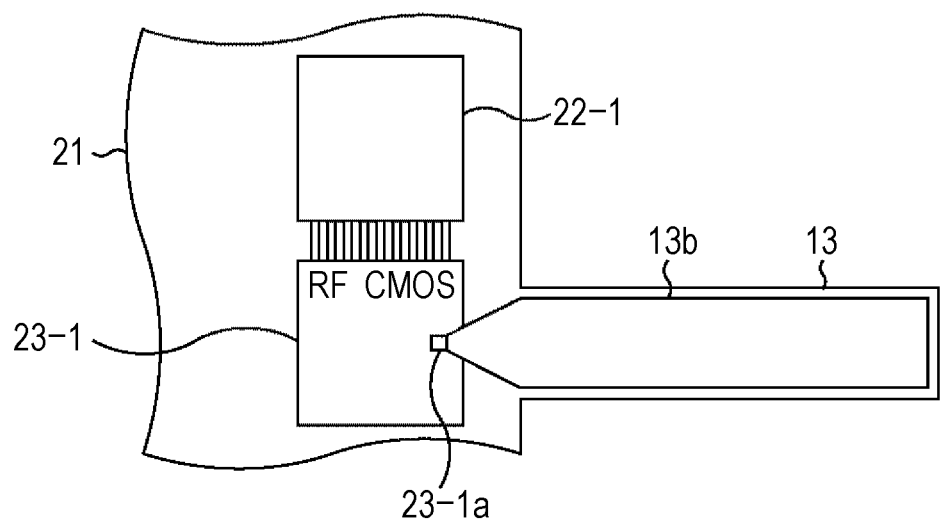
FIGS. 12A and 12B illustrate positional relations between an output terminal of a RF chip and a tip of the cable.
Figure 12B:
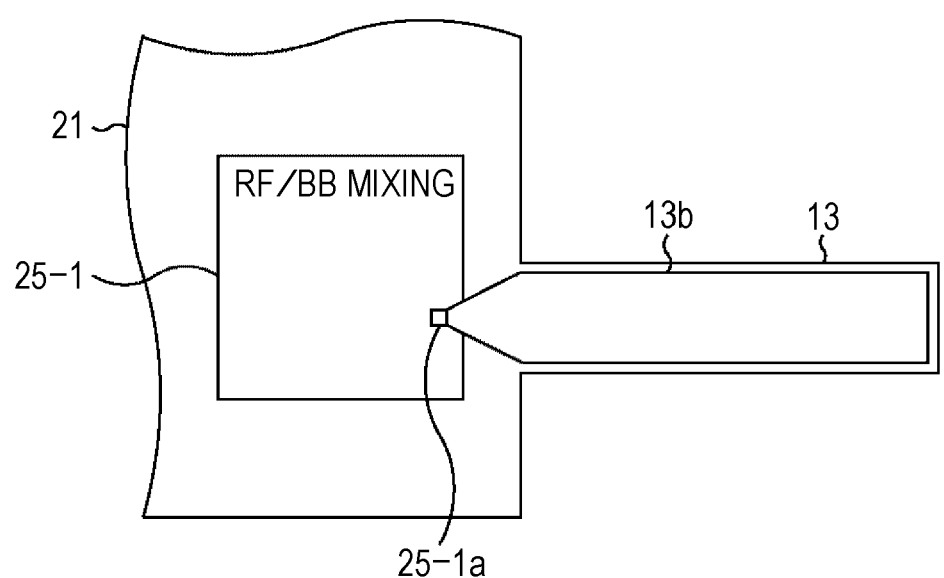

FIGS. 12A and 12B illustrate positional relations between the output terminal of the RF chip 23-1 and the tip of the cable 13.

In an example of FIG. 12A, the BB chip 22-1 and the RF chip 23-1 are arranged side by side in the vertical direction. The cable 13 is arranged to be extended in a horizontal direction in FIG. 12A, a tip portion of the cable 13 on the left side of FIG. 12A is connected to an output terminal (signal pad) 23-1a of the RF chip 23-1 for the high-frequency. That is, the metallic layer 13b of the cable 13 is linearly arranged in the horizontal direction in FIG. 12A, and a tip of the metallic layer 13b is connected to the output terminal 23-1a.

In an example of FIG. 12B, a chip (RF/BB mixed chip) 25-1, into which the functions of the BB chip 22-1 and the RF chip 23-1 are integrated, is used. The cable 13 is arranged to be extended in the horizontal direction in FIG. 12B, and the tip portion of the cable 13 on the left side of FIG. 12B is connected to an output terminal 25-1a of the RF/BB mixed chip 25-1 for the high-frequency signal. That is, the metallic layer 13b of the cable 13 is linearly arranged in the horizontal direction in FIG. 12B, and the tip of the metallic layer 13b is connected to the output terminal 25-1a.

Herein, positional relations between the RF chip 23-1 of the transmission side connector 11 and the tip of the cable 13 are described, but positional relations between the RF chip 23-2 of the receiving side connector 12 and the tip of the cable 13 are the same as in the transmission side connector 11.

For easy understanding, in FIGS. 12A and 12B, an end portion of the metallic layer 13b on the left sides of FIGS. 12A and 12B is illustrated to be positioned over the RF chip 23-1 or the RF/BB mixed chip 25-1. However, in practicality, the end portion of the metallic layer 13b on the left sides of FIGS. 12A and 12B is positioned under the RF chip 23-1 or the RF/BB mixed chip 25-1, and thus the end portion of the metallic layer 13b is difficult be seen from above. In addition, in practicality, the output terminal (signal pad) 23-1a is arranged on the surface of the organic multilayer substrate 21-1.

For example, when each chip and the cable are arranged as illustrated in FIG. 12A or 12B, return loss does not occur at elbow-shaped bends of a metallic wire and SI improvement effects, which are acquired when the dielectric layer 13a is shared by the portion of the organic multilayer substrate 21-1, can be maximized.

In addition, for example, when each chip and the cable can be arranged as illustrated in FIGS. 12A and 12B, a shape of the connector can be freely changed.

Figure 13A:
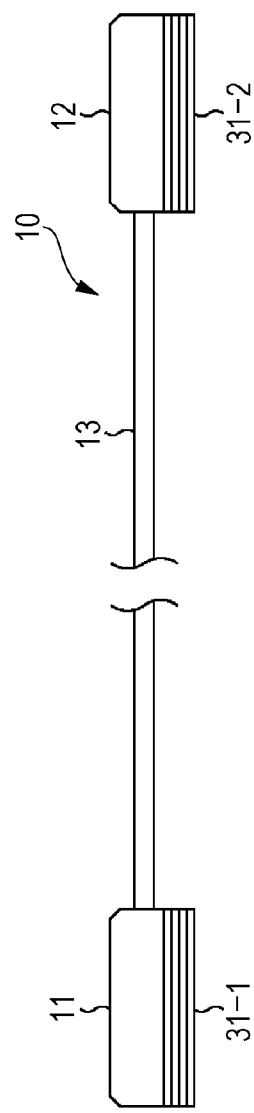
FIGS. 13A to 13C illustrate other shapes of the transmission side connector and the receiving side connector of the flexible flat cable to which the present technology is applied.
Figure 13B:
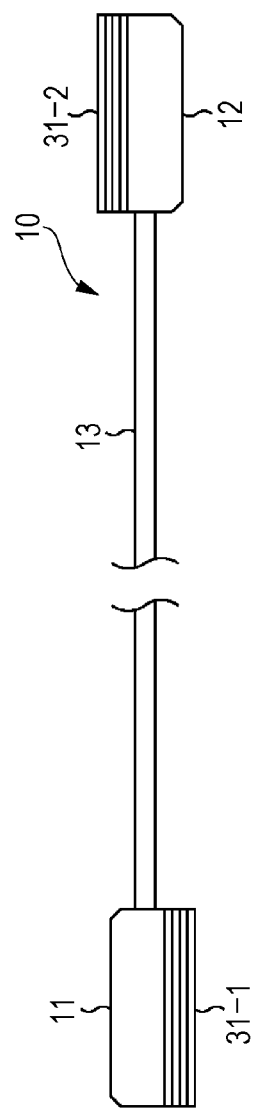
Figure 13C:
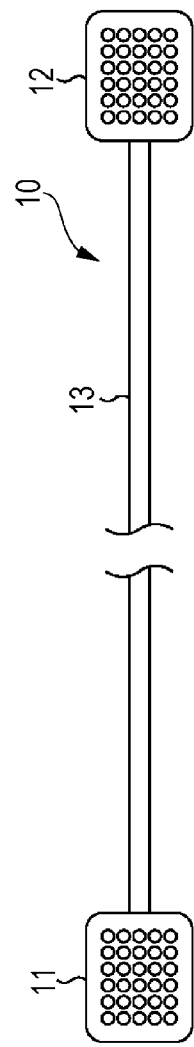

FIGS. 13A to 13C illustrate other shapes of the transmission side connector 11 and the receiving side connector 12 of the flexible flat cable 10 to which the present technology is applied.

In a configuration of FIG. 13A, the input terminal 31-1 of the transmission side connector 11 and the output terminal 31-2 of the receiving side connector 12 have a plurality of metallic terminals arranged in parallel in the same direction as that in which the cable 13 is extended. In the configuration of FIG. 13A, both of the input terminal 31-1 of the transmission side connector 11 and the output terminal 31-2 of the receiving side connector 12 are provided on a lower side in FIG. 13A.

In a configuration of FIG. 13B, the input terminal 31-1 of the transmission side connector 11 and the output terminal 31-2 of the receiving side connector 12 have a plurality of metallic terminals arranged in parallel in the same direction where the cable 13 is extended. In the configuration of FIG. 13B, the input terminal 31-1 of the transmission side connector 11 is provided on a lower side in FIG. 13B, and the output terminal 31-2 of the receiving side connector 12 is provided on an upper side in FIG. 13B.

In a configuration of FIG. 13C, the input terminal 31-1 of the transmission side connector 11 and the output terminal 31-2 of the receiving side connector 12 have a plurality of metallic terminals arranged in a matrix.

In the configuration of FIG. 13A or 13B, an arrangement of the input terminal 31-1 and the output terminal 31-2 is a land grid array (LGA), and an arrangement of the input terminal 31-1 and the output terminal 31-2 is a ball grid array (BGA) in the configuration of FIG. 13C.

As described above, according to the present technology, high-quality, high-speed communication can be realized without increasing a mounting space.

That is, freedom of design can be increased due to high flexibility. Furthermore, since high EMC performance is ensured and it is not necessary to pay attention to insulation, it is not necessary for a shield part to be mounted. As a result, data capacity can be ensured with a mounting space being reduced. That is, the volume of wire per transmission capacity becomes small and a mounting space can be reduced.

A series of processes described above in the specification are certainly performed in chronological order according to the described sequence. The series of processes may be performed not only in time series but also in parallel or individually.

In addition, embodiments of the present technology are not limited to the embodiments described above, and a variety of changes can be made without departing from the scope and spirit of the present technology.

The present technology can take the following configuration.

One configuration of the present technology is a signal transmission cable, comprising: a cable including a dielectric layer and a metallic layer; and a connector having a chip with a terminal, the connector including a substrate having an organic layer, a portion of the organic layer extending from the substrate so as to form the dielectric layer of the cable, the metallic layer being located on the dielectric layer and being directly connected to the terminal.

Another configuration of the present technology is the signal transmission cable of the preceding configuration, wherein the substrate has a plurality of stacked layers, one of the plurality of stacked layers being the organic layer.

Yet another configuration of the present technology is the signal transmission cable of any one of the preceding configurations, wherein all of the plurality of stacked layers are organic layers.

Yet another configuration of the present technology is the signal transmission cable of any one of the preceding configurations, wherein the cable has a plurality of layers, one of the plurality of layers being the dielectric layer.

Yet another configuration of the present technology is the signal transmission cable of any one of the preceding configurations, wherein the cable has a substrate integrated waveguide structure.

Yet another configuration of the present technology is the signal transmission cable of any one of the preceding configurations, wherein the cable includes at least one signal line layer and at least one power line layer.

Yet another configuration of the present technology is the signal transmission cable of any one of the preceding configurations, wherein the cable is configured to transmit at least one signal modulated by a carrier wave, the carrier wave having a frequency of greater than or equal to 30 GHz.

Yet another configuration of the present technology is the signal transmission cable of any one of the preceding configurations, wherein the cable is configured to transmit a plurality of signals simultaneously, the plurality of signals respectively modulated by a plurality of different carrier waves each having a frequency greater than or equal to 30 GHz.

Yet another configuration of the present technology is the signal transmission cable of any one of the preceding configurations, wherein the chip is configured to convert between a parallel signal and a serial signal.

Yet another configuration of the present technology is the signal transmission cable of any one of the preceding configurations, wherein the chip is configured to encode or decode a signal.

Yet another configuration of the present technology is the signal transmission cable of any one of the preceding configurations, wherein the chip is configured to modulate or demodulate a signal.

Yet another configuration of the present technology is the signal transmission cable of any one of the preceding configurations, wherein the chip is configured to multiplex or demultiplex a signal.

Yet another configuration of the present technology is the signal transmission cable of any one of the preceding configurations, wherein the dielectric constant of the dielectric layer is less than 3.5, and the dielectric dissipation factor of the dielectric layer is less than 0.003.

Yet another configuration of the present technology is the signal transmission cable of any one of the preceding configurations, wherein the connector is a transmission side connector, the terminal of the chip being an output terminal, and further comprising: a reception side connector having a second chip with an input terminal, the reception side connector including a second substrate having a second organic layer, a portion of the second organic layer extending from the second substrate so as to form the dielectric layer of the cable at the reception side, the metallic layer being directly connected to the input terminal Yet another configuration of the present technology is a connector for a signal transmission cable, the connector comprising: a chip including a terminal; and a substrate including an organic layer, a portion of the organic layer extending from the substrate so as to form a dielectric layer of a cable, a metallic layer being located on the dielectric layer and being directly connected to the terminal.

Yet another configuration of the present technology is the signal transmission cable of the preceding configuration, wherein the substrate has a plurality of stacked layers, one of the plurality of stacked layers being the organic layer.

Yet another configuration of the present technology is the signal transmission cable of any one of the preceding configurations, wherein all of the plurality of stacked layers are organic layers.

Yet another configuration of the present technology is the signal transmission cable of any one of the preceding configurations, wherein the cable has a plurality of layers, one of the plurality of layers being the dielectric layer.

Yet another configuration of the present technology is the signal transmission cable of any one of the preceding configurations, wherein the cable has a substrate integrated waveguide structure.

Yet another configuration of the present technology is the signal transmission cable of any one of the preceding configurations, wherein the cable is configured to transmit at least one signal modulated by a carrier wave, the carrier wave having a frequency of greater than or equal to 30 GHz.

Yet another configuration of the present technology is the signal transmission cable of any one of the preceding configurations, wherein the cable is configured to transmit a plurality of signals simultaneously, the plurality of signals respectively modulated by a plurality of different carrier waves each having a frequency greater than or equal to 30 GHz.

Yet another configuration of the present technology is the signal transmission cable of any one of the preceding configurations, wherein the dielectric constant of the dielectric layer is less than 3.5, and the dielectric dissipation factor of the dielectric layer is less than 0.003.

Yet another configuration of the present technology is a substrate for a connector of a signal transmission cable, the substrate comprising: an organic layer, a portion of the organic layer extending from the substrate so as to form a dielectric layer of a cable; and a metallic layer located on the dielectric layer and being configured for direct connection to a terminal of a chip.

Yet another configuration of the present technology is the signal transmission cable of the preceding configuration, wherein the substrate has a plurality of stacked layers, one of the plurality of stacked layers being the organic layer.

Yet another configuration of the present technology is the signal transmission cable of any one of the preceding configurations, wherein all of the plurality of stacked layers are organic layers.

Yet another configuration of the present technology is the signal transmission cable of any one of the preceding configurations, wherein the cable has a plurality of layers, one of the plurality of layers being the dielectric layer.

Yet another configuration of the present technology is the signal transmission cable of any one of the preceding configurations, wherein the cable has a substrate integrated waveguide structure.

Yet another configuration of the present technology is the signal transmission cable of any one of the preceding configurations, wherein the cable is configured to transmit at least one signal modulated by a carrier wave, the carrier wave having a frequency of greater than or equal to 30 GHz.

Yet another configuration of the present technology is the signal transmission cable of any one of the preceding configurations, wherein the cable is configured to transmit a plurality of signals simultaneously, the plurality of signals respectively modulated by a plurality of different carrier waves each having a frequency greater than or equal to 30 GHz.

Yet another configuration of the present technology is the signal transmission cable of any one of the preceding configurations, wherein the dielectric constant of the dielectric layer is less than 3.5, and the dielectric dissipation factor of the dielectric layer is less than 0.003.

The present technology can further take the following configuration.

(1)

A signal transmission cable including: a first connector; a second connector; and a cable that connects the first connector and the second connector, wherein each of the first connector and the second connector has at least one layer of organic substrates, wherein the cable has a dielectric layer and a metallic layer, wherein portions of the organic substrates of the first connector and the second connector are extended to form the dielectric layer of the cable, and wherein tips of the metallic layer of the cable are directly connected to input/output terminals of chips arranged on the organic substrates of the first connector and the second connector.

(2)

The signal transmission cable according to (1), wherein the first connector and the second connector have input terminals and output terminals, respectively, which input or output a plurality of signals in parallel, wherein the first connector has a parallel to serial conversion unit that converts parallel signals, which are the plurality of signals input in parallel, to serial signals, and a modulation unit that modulates the serial signals by means of a carrier wave to generate a high-frequency signal, wherein the second connector has a demodulation unit that demodulates the high-frequency signal to generate the serial signals, and a serial to parallel conversion unit that converts the serial signals to the parallel signals, wherein one side of the tips of the metallic layer of the cable is directly connected to an output terminal for the high-frequency signal in a chip which configures the modulation unit, and wherein the other side of the tips of the metallic layer of the cable is directly connected to an input terminal for the high-frequency signal in a chip which configures the demodulation unit.

(3)

The signal transmission cable according to (2), wherein the output terminal for the high-frequency signal in the chip which configures the modulation unit and the input terminal for the high-frequency signal in the chip which configures the demodulation unit are arranged on a longitudinal extension line of the cable, respectively.

(4)

The signal transmission cable according to (2) or (3), wherein a frequency of the carrier wave is set to be equal to or higher than 30 GHz.

(5)

The signal transmission cable according to (4), wherein a dielectric constant of the dielectric layer of the cable is less than 3.5 and the dielectric dissipation factor is less than 0.003.

(6)

The signal transmission cable according to (4) or (5), wherein the high-frequency signal has three or more points of logic levels in one unit interval (UI).

(7)

The signal transmission cable according to any one of (2) to (6), wherein the first connector has a plurality of the parallel to serial conversion units and of the modulation units and a multiplexing unit that can multiplex a plurality of the high-frequency signals on the cable and transmit the multiplexed signals by setting carrier frequencies of the plurality of modulation units to be different from each other, and wherein the second connector has a plurality of the demodulation units and of the serial to parallel conversion units and band-pass filters that separate and extract the plurality of high-frequency signals multiplexed on the cable.

(8)

The signal transmission cable according to any one of (1) to (7), wherein the cable has a substrate integrated waveguide (SIW) structure.

(9)

The signal transmission cable according to any one of (1) to (8), wherein the cable has a region for a signal line for transmitting the high-frequency signal and a region for a power supply line for transmitting a power supply voltage.

(10)

The signal transmission cable according to (9), wherein a power supply unit is provided to supply a power supply voltage to the first connector, and the second connector is driven by the power supply voltage transmitted from the first connector via the cable.

It should be understood by those skilled in the art that various modifications, combinations, sub-combinations and alterations may occur depending on design requirements and other factors insofar as they are within the scope of the appended claims or the equivalents thereof.

What is claimed is:

1. A signal transmission cable, comprising:
   a cable including a dielectric layer and a metallic layer; and
   a connector having a chip with a terminal, the connector including a substrate having an organic layer, a portion of the organic layer extending from the substrate so as to form the dielectric layer of the cable, the metallic layer being located on the dielectric layer and being directly connected to the terminal,
   wherein an end portion of the metallic layer is extended to form a tip portion, the tip portion being directly connected to the terminal.

2. The signal transmission cable of claim 1, wherein the substrate has a plurality of stacked layers, one of the plurality of stacked layers being the organic layer.

3. The signal transmission cable of claim 2, wherein all of the plurality of stacked layers are organic layers.

4. The signal transmission cable of claim 1, wherein the cable has a plurality of layers, one of the plurality of layers being the dielectric layer.

5. The signal transmission cable of claim 4, wherein the cable has a substrate integrated waveguide structure.

6. The signal transmission cable of claim 4, wherein the cable includes at least one signal line layer and at least one power line layer.

7. The signal transmission cable of claim 1, wherein the cable is configured to transmit at least one signal modulated by a carrier wave, the carrier wave having a frequency of greater than or equal to 30 GHz.

8. The signal transmission cable of claim 7, wherein the cable is configured to transmit a plurality of signals simultaneously, the plurality of signals respectively modulated by a plurality of different carrier waves, each having a frequency greater than or equal to 30 GHz.

9. The signal transmission cable of claim 1, wherein the chip is configured to convert between a parallel signal and a serial signal.

10. The signal transmission cable of claim 1, wherein the chip is configured to encode or decode a signal.

11. The signal transmission cable of claim 1, wherein the chip is configured to modulate or demodulate a signal.

12. The signal transmission cable of claim 1, wherein the chip is configured to multiplex or demultiplex a signal.

13. The signal transmission cable of claim 1, wherein the dielectric constant of the dielectric layer is less than 3.5, and the dielectric dissipation factor of the dielectric layer is less than 0.003.

14. The signal transmission cable of claim 1, wherein the connector is a transmission side connector, the terminal of the chip being an output terminal, and further comprising:
a reception side connector having a second chip with an input terminal, the reception side connector including a second substrate having a second organic layer, a portion of the second organic layer extending from the second substrate so as to form the dielectric layer of the cable at the reception side, the metallic layer being directly connected to the input terminal.

15. A connector for a signal transmission cable, the connector comprising:
a chip including a terminal; and
a substrate including an organic layer, a portion of the organic layer extending from the substrate so as to form a dielectric layer of a cable, a metallic layer being located on the dielectric layer and being directly connected to the terminal,
wherein an end portion of the metallic layer is extended to form a tip portion, the tip portion being directly connected to the terminal.

16. The connector of claim 15, wherein the substrate has a plurality of stacked layers, one of the plurality of stacked layers being the organic layer.

17. The connector of claim 16, wherein all of the plurality of stacked layers are organic layers.

18. The connector of claim 15, wherein the cable has a plurality of layers, one of the plurality of layers being the dielectric layer.

19. The connector of claim 18, wherein the cable has a substrate integrated waveguide structure.

20. The connector of claim 15, wherein the cable is configured to transmit at least one signal modulated by a carrier wave, the carrier wave having a frequency of greater than or equal to 30 GHz.

21. The connector of claim 20, wherein the cable is configured to transmit a plurality of signals simultaneously, the plurality of signals respectively modulated by a plurality of different carrier waves, each having a frequency greater than or equal to 30 GHz.

22. The connector of claim 15, wherein the dielectric constant of the dielectric layer is less than 3.5, and the dielectric dissipation factor of the dielectric layer is less than 0.003.

23. A substrate for a connector of a signal transmission cable, the substrate comprising:
an organic layer, a portion of the organic layer extending from the substrate so as to form a dielectric layer of a cable; and
a metallic layer located on the dielectric layer and being configured for direct connection to a terminal of a chip,
wherein an end portion of the metallic layer is extended to form a tip portion, the tip portion being directly connected to the terminal.

24. The substrate of claim 23, wherein the substrate has a plurality of stacked layers, one of the plurality of stacked layers being the organic layer.

25. The substrate of claim 24, wherein all of the plurality of stacked layers are organic layers.

26. The substrate of claim 23, wherein the cable has a plurality of layers, one of the plurality of layers being the dielectric layer.

27. The substrate of claim 26, wherein the cable has a substrate integrated waveguide structure.

28. The substrate of claim 23, wherein the cable is configured to transmit at least one signal modulated by a carrier wave, the carrier wave having a frequency of greater than or equal to 30 GHz.

29. The substrate of claim 28, wherein the cable is configured to transmit a plurality of signals simultaneously, the plurality of signals respectively modulated by a plurality of different carrier waves, each having a frequency greater than or equal to 30 GHz.

30. The substrate of claim 23, wherein the dielectric constant of the dielectric layer is less than 3.5, and the dielectric dissipation factor of the dielectric layer is less than 0.003.

* * * * *